(12) United States Patent
Hino et al.

(10) Patent No.: US 7,812,489 B2
(45) Date of Patent: Oct. 12, 2010

(54) MOTOR

(75) Inventors: Toshifumi Hino, Ehime (JP); Nobuhiko Sato, Ehime (JP)

(73) Assignee: Panasonic Corporation, Osaka (JP)

( * ) Notice: Subject to any disclaimer, the term of this patent is extended or adjusted under 35 U.S.C. 154(b) by 297 days.

(21) Appl. No.: 12/030,272

(22) Filed: Feb. 13, 2008

(65) Prior Publication Data

US 2008/0218010 A1  Sep. 11, 2008

(30) Foreign Application Priority Data

Mar. 6, 2007 (JP) ............................... 2007-054961

(51) Int. Cl.
*H02K 5/22* (2006.01)
*H02K 3/50* (2006.01)

(52) U.S. Cl. ........................................ 310/71; 174/262

(58) Field of Classification Search .................. 310/71; 174/276, 262; *H02K 5/22, 3/50*
See application file for complete search history.

(56) References Cited

U.S. PATENT DOCUMENTS

| | | | | |
|---|---|---|---|---|
| 4,193,604 A | * | 3/1980 | Sarvanne | 174/658 |
| 5,333,079 A | * | 7/1994 | Takegami et al. | 360/99.08 |
| 5,632,630 A | * | 5/1997 | Card et al. | 439/79 |
| 6,097,121 A | * | 8/2000 | Oku | 310/91 |
| 2002/0047504 A1 | * | 4/2002 | Takahashi | 310/DIG. 6 |
| 2005/0206255 A1 | * | 9/2005 | Yoshino et al. | 310/71 |
| 2007/0194641 A1 | * | 8/2007 | Kanatani et al. | 310/71 |
| 2009/0115271 A1 | * | 5/2009 | Takahashi et al. | 310/71 |

FOREIGN PATENT DOCUMENTS

| | | |
|---|---|---|
| JP | 2551167 | 6/1997 |
| JP | 2000-209804 | 7/2000 |
| JP | 2005-210787 | 8/2005 |

* cited by examiner

*Primary Examiner*—Quyen Leung
*Assistant Examiner*—Terrance Kenerly
(74) *Attorney, Agent, or Firm*—Steptoe & Johnson LLP

(57) ABSTRACT

The present invention provides a motor that enables a lead of a coil to be appropriately led through holes, while allowing the lead of the coil to be fixed without contacting a wall surface of the hole in a base. Cuts 14*b* are formed in an insulating sheet or a printed circuit board 14; the cuts 14*b* extend substantially radially or spirally from a lead lead-out portion 14*a* as a center. Thus, even if an end of the lead 7*a* abuts against an area located outside the lead lead-out portion 14*a*, the abutting area and a nearby area located in the vicinity of the abutting area are pushed open along the cuts 14*b* extending from the lead lead-out portion 14*a* and guide the end of the lead 7*a* toward the lead lead-out portion 14*a*. The end of the lead 7*a* is thus appropriately guided into the lead lead-out portion 14*a*.

8 Claims, 12 Drawing Sheets

MOTOR

FIELD OF THE INVENTION

The present invention relates to a motor built in a hard disk drive or the like.

BACKGROUND OF THE INVENTION

A motor of this kind is disclosed in, for example, Japanese Utility Model Laid-Open No. 2551167. The motor disclosed in Japanese Utility Model Laid-Open No. 2551167 is made up of a stator 52 fixed to a base 51 as a non-rotating portion and a rotor 53 rotating integrally with a rotating shaft as a rotating portion as shown in FIG. 10. The stator 52 has a bearing 54 and a bearing housing 55, a core 56 having a salient pole, and a coil 57 wound around the salient pole of the core 56. The rotor 53 has driving magnets 58 made up of permanent magnets which are coaxially disposed on an inner periphery of a hub (rotor case) 59 holding a disk and opposite the core 56 across a small gap so that N poles and S poles are alternately arranged in a circumferential direction. In FIG. 10, a part of the base 51 constitutes the bearing housing 55, which is shaped like an upright cylinder.

As shown in FIGS. 10 and 11A, an insulating sheet 60 is provided on a motor-interior-side surface of the base 51. A flexible printed circuit board (FPC) 61 is provided on a motor-exterior-side surface of the base 51. Holes 51a, 60a, and 61a that are in communication with one another are formed in the base 51, the insulating sheet 60, and the flexible printed circuit board 61, respectively. Leads 57a of the coil 57 are led out of the motor through the holes 51a, 60a, and 61a. The leads 57a are connected to respective lands formed on the flexible printed circuit board 61 with a solder 62. In general, the diameter d1 of the hole 60a, formed in the insulating sheet 60, is as large as the diameter d2 of the hole 61a, formed in the flexible printed circuit board 61 and is smaller than the diameter d3 of the hole 51a, formed in the base 51. This configuration allows the regulation of the positions of the leads 57a of the coil 57 inserted through the holes 51a, 60a, and 61a by the hole 60a of the insulating sheet 60 and the hole 61a of the flexible printed circuit board 61, preventing the leads 57a from contacting an inner peripheral wall surface of the hole 51a in the base 51. This maintains the insulation (an appropriate breakdown voltage) between each of the leads 57a of the coil 57 and the base 51.

However, in the above-described conventional configuration, the diameter d1 of the hole 60a in the insulating sheet 60 and the diameter d2 of the hole 61a in the flexible printed circuit board 61 are both small. Drawing out the leads 57a of the coil 57 is thus difficult. In particular, it is very difficult to lead the lead 57a of the coil 57 through the hole 61a in the flexible printed circuit board 61, which is located inside when the lead 57a is drawn out of the motor. Thus, disadvantageously, the lead 57a of the coil 57 may be entangled inside the hole 51a in the base 51 as shown in FIG. 11B.

To solve this problem, Japanese Patent Laid-Open No. 2005-210787 proposes a motor in which the diameter d11 of a hole 71a in a flexible printed circuit board 71 and the diameter d12 of a hole 72a in an insulating sheet 72 are both set smaller than the diameter d13 of a hole 73a in a base 73 and in which the diameter d11 of the hole 71a in the flexible printed circuit board 71 is set greater than the diameter d12 of the hole 72a in the insulating sheet 72 as shown in FIG. 12.

With this configuration, when drawing out leads 74a of a coil 74, the same can be easily led through the hole 71a in the flexible printed circuit board 71, located inside. This makes it possible to prevent the leads 74a of the coil 74 from being disadvantageously entangled inside the hole 73a in the base 73.

Japanese Patent Laid-Open No. 2000-209804 proposes a motor having a substantially V-shaped guide portion 83 formed in a flexible printed circuit board 81 so that leads 82 of a coil can be guided through the guide portion 83, and a cut 85 formed in the flexible printed circuit board 81 so as to allow the guide portion 83 to communicate with a coil insertion hole 84 through which the leads 82 of the coil are led as shown in FIG. 13. The coil insertion hole 84 is formed at a position where in a plan view, the coil insertion hole 84 appears to overlap a central part of a hole 86 in a base. The guide portion 83 of the flexible printed circuit board 81 is formed at a position such that the guide portion 83 is finally located outside the hole 86 in the base, that is, such that the guide portion 83 finally overlaps a motor-exterior-side surface of the base.

This configuration allows the leads 82 of the coil to be easily drawn out to an area close to the center of the hole 86 in the base without contacting a peripheral surface constituting the hole 86 in the base.

However, in the configuration disclosed in Japanese Patent Laid-Open No. 2005-210787, the interior of the hole 73a in the base 73 and the interior of the hole 71a in the flexible printed circuit board 71 are hollow. Thus, disadvantageously, the leads 74a of the coil 74 are not held in the holes 73a and 71a and are thus unstable. To eliminate this disadvantage, a resin such as an adhesive may be poured into the hole 73a in the base 73 to fix the leads 74a. In this case, the resin may leak out of the hole 71a in the flexible printed circuit board 71 or the hole 72a in the insulating sheet 72 (in particular, when the resin is poured into the hole 72a in the insulating sheet 72, the resin is likely to leak out of the hole 71a in the flexible printed circuit board 71). This prevents the leads 74a from being appropriately fixed.

In contrast, with the configuration disclosed in Japanese Patent Laid-Open No. 2000-209804, when the diameter of the coil insertion hole 84, through which the leads 82 of the coil are lead, corresponds to the number or size of the leads 82 led through the coil insertion hole 84, the resin can be prevented from flowing out of the hole 86 in the base. However, in the configuration, the substantially V-shaped guide portion 83, through which the leads 82 of the coil are guided, is formed by notching the flexible printed circuit board 81. Consequently, when the flexible printed circuit board 81 is stuck to a sticking surface of the base (the motor-exterior-side surface of the motor), only the notch portion in which the guide portion 83 is formed has a smaller sticking area. Thus, disadvantageously, the flexible printed circuit board 81 easily peels off the sticking surface in the notch portion.

Furthermore, the configuration disclosed in Japanese Patent Laid-Open No. 2000-209804 requires the following operation. With the flexible printed circuit board 81 not stuck to the motor-exterior-side surface of the base yet, the leads 82 of the coil are led through the hole in the insulating sheet stuck to the motor-interior-side surface of the base. The flexible printed circuit board 81 is then moved so that the leads 82 of the coil are inserted into the coil insertion hole 84 via the guide portion 83 in the flexible printed circuit board 81. The flexible printed circuit board 81 is further stuck to the base.

This operation disadvantageously requires much time and effort, resulting in degraded workability.

DISCLOSURE OF THE INVENTION

The present invention eliminates the above-described disadvantages and solves the above-described problems. An object of the present invention is to provide a motor that enables a lead of a coil to be appropriately led through holes in an insulating sheet, a base, and a printed circuit board, while allowing the lead of the coil to be fixed with a resin with a predetermined breakdown voltage maintained and without contacting a wall surface of the hole in the base, the motor also making it possible to prevent the resin from flowing out of the holes.

To accomplish the object, the motor according to the present invention includes a substantially planar base, a core directly or indirectly fixed to a first surface of the base and having a salient pole, a coil wound around the salient pole of the core, an insulating sheet made of a flexible material and disposed on the first surface of the base, a printed circuit board made of a flexible material and disposed on a second surface of the base, a base hole disposed in the base and penetrating the base from the first surface to the second surface, lead lead-out portions formed in the printed circuit board and the insulating sheet, respectively, at a position located opposite the base hole, a cut formed so as to be continuous with the lead lead-out portion in at least one of the printed circuit board and the insulating sheet and extending substantially radially or spirally toward a periphery of the lead lead-out portion, a lead penetrating the lead lead-out portion in the insulating sheet, the base hole, and the lead lead-out portion in the printed circuit board and electrically connected to a land formed on the printed circuit board, the lead being held by the lead lead-out portion by deforming the periphery of the lead lead-out portion when penetrating the lead lead-out portion around which the cut is formed, and a resin poured into the base hole between the insulating sheet and the printed circuit board to fix the lead inside the base hole.

In the above-described configuration, the cut is formed so as to be continuous with the lead lead-out portion in at least one of the printed circuit board and the insulating sheet and extend substantially radially or spirally toward the periphery of the lead lead-out portion. Thus, even if an end of the lead abuts against an area located outside the lead lead-out portion, the abutting area and its nearby area are pushed open along the cut extending from the lead lead-out portion. The areas are tilted so as to guide the end of the lead toward the lead lead-out portion. As a result, the end of the lead is appropriately guided to and introduced into the lead lead-out portion. Consequently, even if the lead lead-out portion formed in the printed circuit board or the insulating sheet is small, the lead kept in tight contact with the area of the printed circuit board or the insulating sheet in which the cut is formed can be led through the lead lead-out portion. Thus, even if the resin is poured into the lead lead-out portion in the base, the resin can be prevented from flowing out. Furthermore, a guide portion through which the end of the lead is guided is not formed in the insulating sheet or the flexible printed circuit board. This prevents a decrease in the area of a part of the insulating sheet or flexible printed circuit board which is stuck to the base. This in turn prevents the insulating sheet or the flexible printed circuit board from disadvantageously peeling easily off the base. Additionally, the lead can be led through the lead lead-out portion after the insulating sheet and the printed circuit board have been stuck to the base. This improves working efficiency.

Furthermore, the lead lead-out portion around which the cut is formed is preferably a hole smaller than thickness of the lead penetrating the lead lead-out portion. Thus, when led through the lead lead-out portion, the lead is in tight contact with the insulating sheet or the printed circuit board, making it possible to more reliably prevent the resin from flowing out. This also improves reliability.

Furthermore, the cut is formed only in an area located inside the base hole. Thus, even if the lead moves along the cuts before the resin is solidified, an appropriate breakdown voltage can be maintained, improving the reliability.

BRIEF DESCRIPTION OF THE DRAWINGS

FIGS. 9A to 8C are plan views of an essential part of the motor, showing another example of a lead lead-out portion according to an embodiment of the present invention;

DESCRIPTION OF THE EMBODIMENTS

Embodiments of the present invention will be described below with reference to the drawings.

Figure 1:
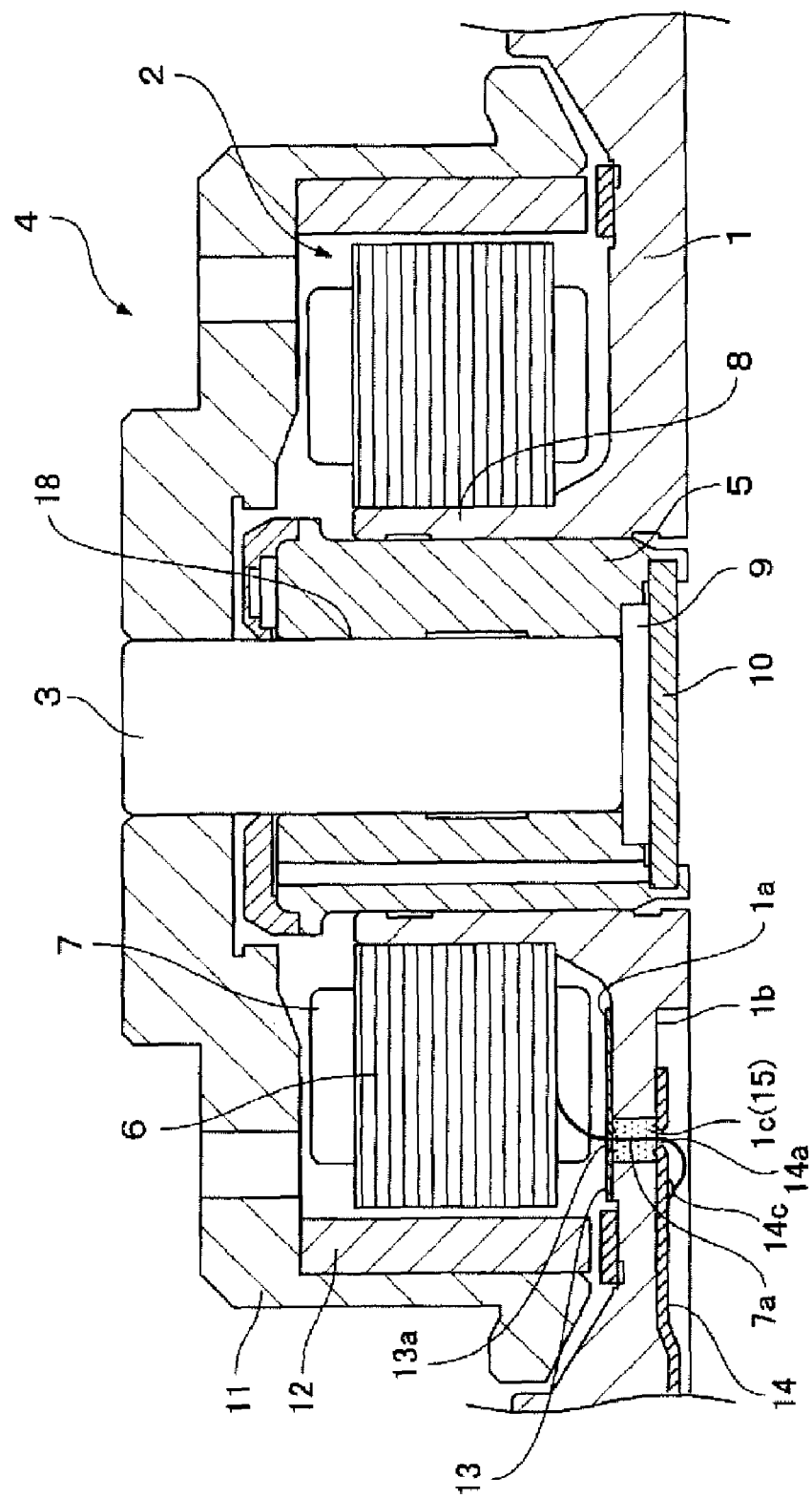
FIG. 1 is a sectional view of a motor according to an embodiment of the present invention.

As shown in FIG. 1, a motor according to an embodiment of the present invention is made up of a stator 2 fixed to a base 1 as a non-rotating portion and a rotor 4 rotating integrally with a rotating shaft 3 as a rotating portion.

The stator 2 has the base 1, a sleeve 5 forming a bearing 18 (in the present embodiment, a fluid bearing in which a working fluid such as a lubricant is filled; however, the present invention is not limited to the fluid bearing) between the sleeve 5 and the rotating shaft 3, a core 6 having a salient pole, and a coil 7 wound around the salient pole of the core 6. In the present embodiment, a central part of the base 1 is integrally formed like a cylinder so as to constitute a bearing housing 8 holding the sleeve 5. A thrust flange 9 is integrally fixed to the rotating shaft 3. A thrust plate 10 is fixed to the end of the sleeve 5.

The rotating shaft 3 of the rotor 4 has a cylindrical bottomed hub (also referred to as a motor case or a rotor frame) 11 located at a projecting portion (leading end) to support a magnetic disk that is a hard disk. Driving magnets 12 made up of permanent magnets are coaxially arranged on an inner periphery of the cylindrical portion of the hub 11 opposite the core 6 across a small gap so that N poles and S poles are alternately arranged in a circumferential direction.

As shown in FIG. 1, an insulating sheet 13 is stuck to a motor-interior-side surface 1a of the base 1. A flexible printed circuit board (FPC) 14 as a printed circuit board is stuck to a motor-exterior-side surface 1b of the base 1. A base hole and lead lead-out portions (hereinafter simply referred to as holes) 1c, 13a, 14a shaped substantially like circles (including ellipses and ovals) or polygons are formed in the base 1, the insulating sheet 13, and the flexible printed circuit board 14, respectively; the base hole and the lead lead-out portions are in communication with one another. A lead 7a of the coil 7 is led out of the motor through the holes 1c, 13a, and 14a and is connected with solder to a land 14c formed on the flexible printed circuit board 14.

As shown in FIGS. 2A, 2B, 3A, and 4A, the hole 13a in the insulating sheet 13 and the hole 14a in the flexible printed circuit board 14 are each smaller than the hole 1c in the base 1 (has a smaller diameter than the hole 1c in the base 1). The hole 13a in the insulating sheet 13 and the hole 14a in the flexible printed circuit board 14 are formed so as to appear, in a plan view, to overlap a substantially central part of the hole 1c in the base 1. For easier understanding, in FIGS. 2A and 2B, the position of the hole 1c in the base 1 in a plan view is shown by a dotted line.

In addition to the above-described arrangements, a plurality of cuts 13b and 14b are formed radially around the hole 13a in the insulating sheet 13 and the hole 14a in the flexible printed circuit board 14, respectively. Thus, the areas between the cuts 13b in the insulating sheet 13 and between the cuts 14b in the flexible printed circuit board 14 can be opened and closed like a valve using parts of the areas lying opposite the hole 13a or 14a as leading ends. In the present embodiment, the cuts 13b and 14b are formed within the area in which the hole 1c in the base 1 is formed in a plan view, more specifically, the cuts 13b and 14b are formed so that the distance between each of the cuts 13b and 14b and the hole 1c in the base 1 corresponds to a predetermined breakdown voltage.

Figure 3A:
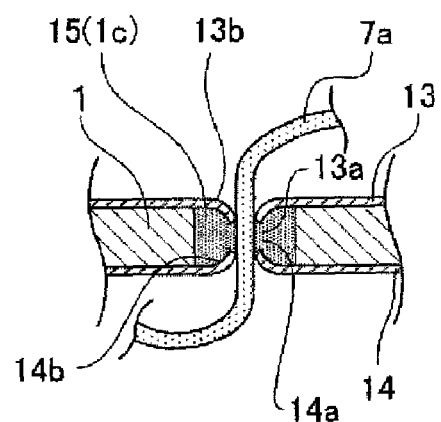
FIG. 3A is a sectional view of an essential part of the motor including a hole in a base and components provided in the vicinity of the hole.
Figure 3B:
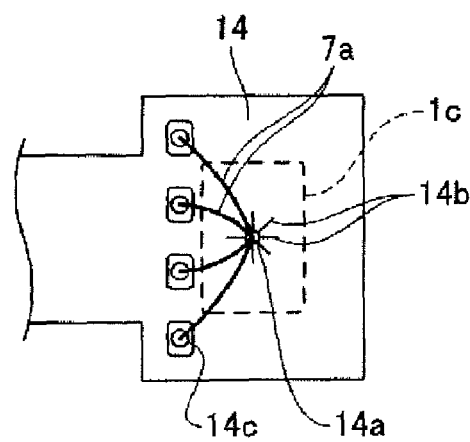
FIG. 3B is a plan view (bottom view) of the essential part as viewed from below.

As shown in FIG. 3A, an adhesive 15 is filled in the hole 1c in the base 1 between the insulating sheet 13 and the flexible printed circuit board 14.

In the present embodiment, the diameter of each of the hole 13a in the insulating sheet 13 and the hole 14a in the flexible printed circuit board 14 is equal to or smaller than the thickness of the lead 7a led through the holes 13a and 14a (when the single lead 7a of the coil 7 is led through the holes 13a and 14a) or equal to or smaller than the total thickness of a group of a plurality of the leads 7a led through the holes 13a and 14a (when a plurality of the leads 7a of the coil 7 are led through the holes 13a and 14a).

Now, with reference to FIGS. 4A to 4E, description will be given of for example, a method of leading the lead 7a of the coil 7 through the hole in the above-described configuration. With reference to the figures showing the steps, for easy understanding, description will be given of the case in which the single lead 7a of the coil 7 is led through the hole. However, the present invention is not limited to this case. When a plurality of the leads 7a of the coil 7 are led through the hole, the operation of inserting the lead 7a of the coil 7 may be repeated.

Figure 4A:
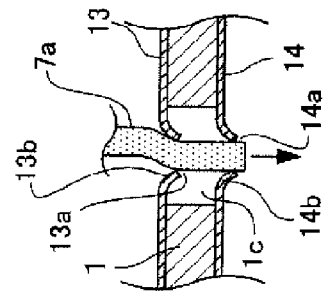
FIGS. 4A to 4E are sectional views showing steps of leading a lead of a coil through the hole according to a first embodiment of the present invention.
Figure 4B:
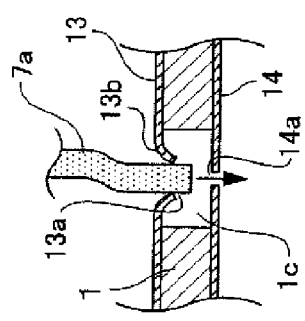

First, as shown in FIG. 4A, the end of the lead 7a of the coil 7 is pressed against the hole 13a in the insulating sheet 13 stuck to the motor-interior-side surface of the base 1 or an area close to the hole 13a. Thus, as shown in FIG. 4B, the area of the insulating sheet 13 pressed by the end of the lead 7a and its nearby area are pushed open like a valve along the cuts 13b in the insulating sheet 13 and tilted so as to guide the lead 7a toward a central part of the cuts 13b. As a result, the end of the lead 7a is introduced into the hole 13a more widely opened in the central part of the cuts 13b. At this time, since the end of the lead 7a is guided toward the central part of the cuts 13b in the insulating sheet 13, the end is guided to an almost central part of the hole 1c in the base 1 which has a predetermined fixed distance from a wall surface portion of the hole 1c. This offers an appropriate insulating condition (the appropriate breakdown voltage).

Figure 4C:
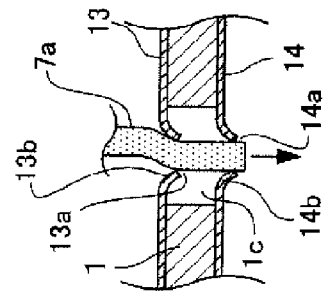

The end of the lead 7a led through the insulating sheet 13 is further pushed toward the exterior of the motor so as to abut against the hole 14a in the flexible printed circuit board 14 and an area close to the hole 14a. As shown in FIG. 4C, the area of the flexible printed circuit board 14 against which the end of the lead 7a abuts and the nearby area are pushed open like a valve along the cuts 14b in the flexible printed circuit board 14 and tilted so as to guide the lead 7a toward a central part of the cuts 14b. As a result, the end of the lead 7a is introduced into the hole 14a more widely opened in the central part of the cuts 14b. The lead 7a can thus be appropriately led through the flexible printed circuit board 14.

Figure 4D:
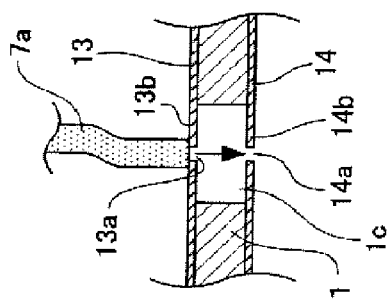

The lead 7a is surely inserted from the interior to exterior of the motor. In this condition, as shown in FIG. 4C, the leading ends (parts of the cuts 13b which are located opposite the hole 13a in the insulating sheet 13 and areas close to these parts) of the areas between the cuts 13b in the insulating sheet 13 surrounding and tightly contacting the lead 7a are pushed downward, that is, into the hole 1c in the base 1. The leading ends (parts of the cuts 14b which are located opposite the hole 14a in the flexible printed circuit board 14 and areas close to these parts) of the areas between the cuts 14b in the flexible printed circuit board 14 also surrounding and tightly contacting the lead 7a project toward the exterior of the motor. However, in some cases, the flexible printed circuit board 14 and the like must not stick out downward from the position of a bottom surface of the base 1 or the external dimensions of the base 1 have no margin. Thus, in these cases, as shown in FIG. 4D, the leading ends of the areas between the cuts 14b in the flexible printed circuit board 14 are folded into the hole 1c in the base 1 using a jig or the like, so that the flexible printed circuit board 14 can be prevented from projecting toward the exterior of the motor.

Figure 4E:
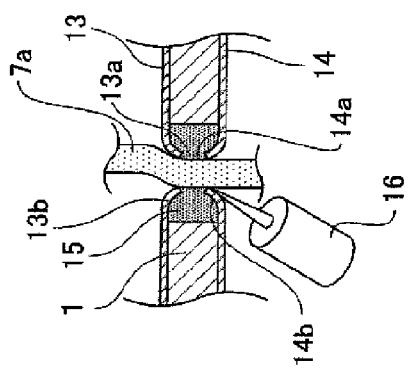

Subsequently, as shown in FIG. 4E, an adhesive 15 is poured through gaps formed by the cuts 14b in the flexible printed circuit board 14 or through the periphery of the hole 14a using a dispenser 16 or the like. The lead 7a can thus be fixed to an almost central position in the hole 1c in the base 1 and held in an appropriate insulating condition (the appropriate breakdown voltage). During the pouring of the adhesive 15, the leading ends (the parts of the cuts 14b which are located opposite the hole 14a in the flexible printed circuit board 14 and the areas close to these parts) of the areas between the cuts 13b and 14b in the insulating sheet 13 and the flexible printed circuit board 14, respectively, surround and tightly contact the lead 7a, minimizing the gap between the lead 7a and the insulating sheet 13 or the flexible printed circuit board 14. This makes it possible to appropriately prevent the adhesive 15 from flowing toward the interior or exterior of the motor. The lead 7a can be led through the motor after the insulating sheet 13 and the flexible printed circuit board 14 have been stuck to the base 1. This improves working efficiency.

Furthermore, the technique of forming a guide portion through which the end of the lead is guided as disclosed in Japanese Patent Laid-Open No. 2000-209804 is not adopted for the insulating sheet 13 or the flexible printed circuit board 14. This prevents a decrease in the area of the part of the insulating sheet 13 or flexible printed circuit board 14 which is stuck to the base 1 and also prevents the insulating sheet 13 or flexible printed circuit board 14 from disadvantageously peeling easily off the base 1.

In the present embodiment, the adhesive 15 is poured into the motor from the flexible printed circuit board 14. However, the present invention is not limited to this aspect. Since both the insulating sheet 13 and the flexible printed circuit board 14 are in tight contact with the lead 7a of the coil 7, the present invention can be appropriately applied to the case in which the adhesive 15 is poured into the motor from the insulating sheet 13, while appropriately preventing the adhesive 15 from flowing out through the hole 1c in the base 1.

As described above, in the present embodiment, the cuts 13b and 14b and the holes 13a and 14a are formed in the insulating sheet 13 and the flexible printed circuit board 14, respectively. Thus, the adhesive 15 can advantageously be poured into the motor either from the flexible printed circuit board 14 or from the insulating sheet 13.

In contrast, if the adhesive 15 can be poured into the motor from only one of the flexible printed circuit board 14 and the insulating sheet 13, the cuts 13b and the hole 13a (or the cuts 14b and hole 14a) may be formed only in the member (the insulating sheet 13 or flexible printed circuit board 14) disposed opposite the side from which the adhesive 15 is poured into the motor. The hole 13a or 14a formed in the member (the insulating sheet 13 or flexible printed circuit board 14) from which the adhesive 15 is poured into the motor may be smaller than the hole 1c in the base 1 and have a size appropriate to prevent the adhesive from flowing to the exterior of the motor owing to surface tension, gravity, or the like.

Figure 2A:
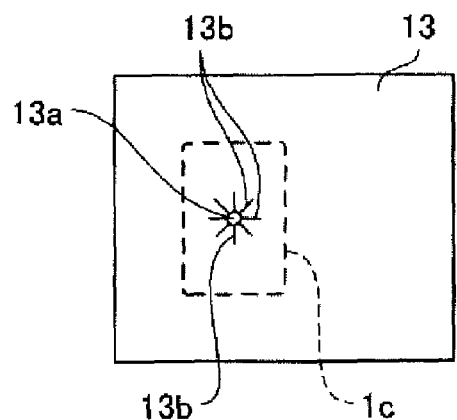
FIG. 2A is a plan view of an insulating sheet in the motor.
Figure 5A:
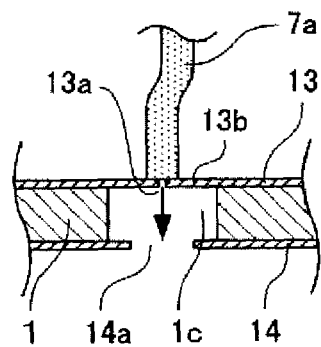
FIGS. 5A to 5C are sectional views showing steps of leading the lead of the coil through the hole according to a second embodiment of the present invention.

That is, if the adhesive 15 can be poured into the motor only from the flexible printed circuit board 14 (from the exterior of the motor), as shown in FIGS. 2A and 5A, the cuts 13b and the hole 13a may be formed only in the insulating sheet 13. The flexible printed circuit board 14 may have the hole 14a formed therein which is smaller than the hole 1c in the base 1 and which has a size appropriate to ensure an insulating condition (the appropriate breakdown voltage), to prevent the adhesive from flowing to the exterior of the motor owing to surface tension, gravity, or the like, to allow the end of the lead 7a to be easily led through the hole, and to allow the adhesive 15 to be easily poured through the hole (that is, the cuts 14b such as those shown in FIG. 28 are not formed in the flexible printed circuit board 14).

Figure 5B:
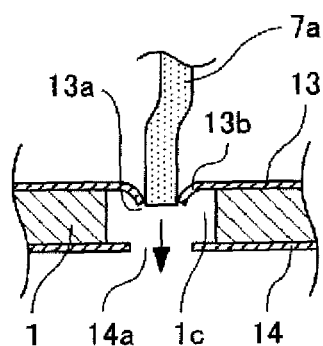

For example, a method of leading the lead 7a of the coil 7 through the motor in this case will be described. First, as shown in FIG. 5A, the end of the lead 7a of the coil 7 is pressed against the hole 13a in the insulating sheet 13 or an area close to the hole 13a. Thus, as shown in FIG. 5B, the area of the insulating sheet 13 pressed by the end of the lead 7a and its nearby area are pushed open like a valve along the cuts 13b in the insulating sheet 13 and tilted so as to guide the lead 7a toward the central part of the cuts 13b. As a result, the end of the lead 7a is introduced into the hole 13a opened in the central part of the cuts 13b. At this time, since the end of the lead 7a is guided toward the central part of the cuts 13b in the insulating sheet 13, the end can be guided to an almost central part of the hole 1c in the base 1 which has a predetermined fixed distance from a wall surface portion of the hole 1c.

Figure 5C:
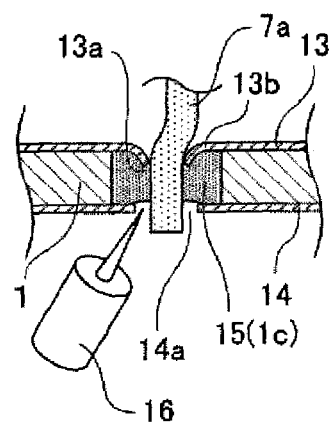

The end of the lead 7a led through the insulating sheet 13 is further pushed in. As shown in FIG. 5C, the end of the lead 7a is led through the hole 1c in the base 1 and the hole 14a in the flexible printed circuit board 14, and the adhesive 15 is poured into the motor through the hole 14a in the flexible printed circuit board 14 using the dispenser 16 or the like. The lead 7a can thus be fixed to an almost central position in the hole 1c in the base 1, allowing the insulating condition (the appropriate breakdown voltage) to be ensured. Also in this case, the leading ends (the parts of the cuts 13b which are located opposite the hole 13a in the insulating sheet 13 and the areas close to these parts) of the areas between the cuts 13b in the insulating sheet 13 disposed opposite the side from which the adhesive 1S is poured into the motor surround the lead 7a and are in pressure contact with the lead 7a, enabling the minimization of the gap between the lead 7a and the insulating sheet 13 or the flexible printed circuit board 14. This makes it possible to appropriately prevent the adhesive 15 from flowing toward the interior of the motor.

The reason why the adhesive 15 can be poured into the motor only from the flexible printed circuit board 14 (from the exterior of the motor) is that for example, the motor is shaped so that the position (the position of the hole 1a in the base 1) where the lead 7a of the coil 7 is led out of the motor is located immediately below the core 6. This prevents the provision of a sealing space into which the adhesive 15 is poured using the dispenser 16, making it difficult to apply the adhesive 15 from the insulating sheet 13. The above-described configuration and method can also be adopted if the hole 14a formed in the flexible printed circuit board 14 must be relatively large in connection with the position where the lead 7a is soldered to the flexible printed circuit board 14.

Figure 2B:
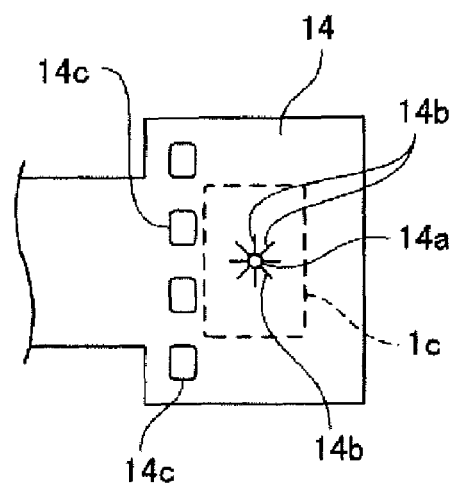
FIG. 2B is a plan view of a flexible printed circuit board in the motor.
Figure 6A:
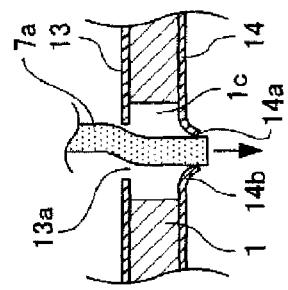
FIGS. 6A to 6E are sectional views showing steps of leading the lead of the coil through the hole according to a third embodiment of the present invention.

On the other hand, if the adhesive 15 can be poured only from the insulating sheet 13, as shown in FIGS. 2B and 6A, the cuts 14b and the hole 14a are formed only in the flexible printed circuit board 14. Only the hole 13a which is smaller than the hole 1c in the base 1 and which makes it possible to ensure the insulating condition (the appropriate breakdown voltage) is formed in the insulating sheet 13 (that is, the cuts 13b such as those shown in FIG. 2A are not formed in the insulating sheet 13). The size of the hole 13a in the insulating sheet 13 is appropriate to prevent the adhesive from flowing to the exterior of the motor owing to surface tension, gravity, or the like, to allow the end of the lead 7a to be easily led through the hole, and to allow the adhesive 15 to be easily poured through the hole.

Figure 6B:
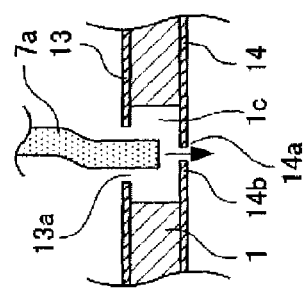
Figure 6D:
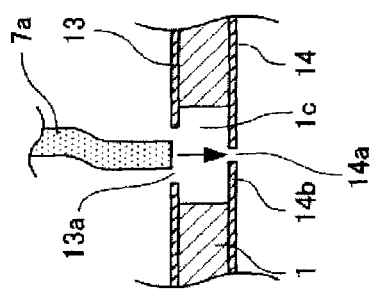
Figure 6C:
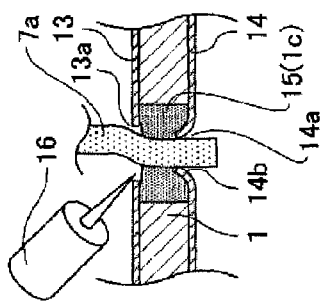

For example, a method of leading the lead 7a of the coil 7 through the motor in this case will be described. First, as shown in FIG. 6A, the end of the lead 7a of the coil 7 is inserted into the hole 13a in the insulating sheet 13. As shown in FIG. 6B, the end of the lead 7a is further inserted into the hole 1e in the base 1 and pressed against an area close to the hole 14a in the flexible printed circuit board 14. Thus, as shown in FIG. 6C, the area of the flexible printed circuit board 14 pressed by the end of the lead 7a and its nearby area are pushed open like a valve along the cuts 14b in the flexible printed circuit board 14 and tilted so as to guide the lead 7a toward the central part of the cuts 14b. As a result, the end of the lead 7a is introduced into the hole 14a opened in the central part of the cuts 14b. The lead 7a can thus be led through the flexible printed circuit board 14.

The lead 7a is surely inserted from the interior to exterior of the motor. In this condition, as shown in FIG. 6C, the leading ends (the parts of the cuts 14b which are located opposite the hole 14a in the flexible printed circuit board 14 and the areas close to these parts) of the areas between the cuts 14b in the flexible printed circuit board 14 surrounding and abutting against the lead 7a project toward the exterior of the motor. However, in some cases, the flexible printed circuit board 14 and the like must not stick out downward from the position of the bottom surface of the base 1 or the dimensions have no margin. Thus, in these cases, as shown in FIG. 6D, the leading ends of the areas between the cuts 14b in the flexible printed circuit board 14 are preferably folded into the hole 1c in the base 1 using a jig or the like.

In this case, since the end of the lead 7a is guided toward the central part of the cuts 14b in the flexible printed circuit board 14, the end can be guided to an almost central part of the hole 1c in the base 1 which has a predetermined fixed distance from the wall surface portion of the hole 1c.

Figure 6E:
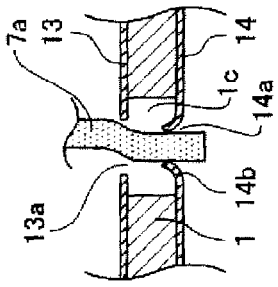

Subsequently, as shown in FIG. 6E, the adhesive 15 is poured into the motor through the hole 13a in the insulating sheet 13 using the dispenser 16 or the like. The lead 7a can thus be fixed to an almost central position in the hole 1c in the base 1, allowing the insulating condition (the appropriate breakdown voltage) to be ensured. Also in this case, the leading ends (the parts of the cuts 14b which are located opposite the hole 14a in the flexible printed circuit board 14 and the areas close to these parts) of the areas between the cuts 14b in the flexible printed circuit board 14, located opposite the side from which the adhesive 15 is poured into the motor, surround and tightly contact the lead 7a, enabling the minimization of the gap between the lead 7a and the flexible printed circuit board 14. This makes it possible to appropriately prevent the adhesive 15 from flowing out toward the exterior of the motor.

The reason why the adhesive 15 can be poured into the motor only from the insulating sheet 13 (from the interior of the motor) is that for example, the end of the lead 7a is soldered directly to an area (a peripheral wall portion of the hole 14a or the like) in which the hole 14a in the flexible printed circuit board 14 is formed, for sealing. In this case, the adhesive 15 cannot be poured through the hole 14a in the flexible printed circuit board 14 and is thus poured into the motor from the insulating sheet 13. The above-described configuration and method can also be adopted if the hole 13a formed in the insulating sheet 13 must be relatively large in connection with the position where the lead 7a is led out from the coil 7.

In the above-described embodiment, the adhesive 15 is poured into the hole 1c in the base 1 shown in FIG. 3A and between the insulating sheet 13 and the flexible printed circuit board 14. However, the present invention is not limited to this aspect. For example, a resin such as a sealing agent, a UV curing resin, a thermosetting resin, or a thermoplastic resin may be used. Also in this case, the leading ends and the like of the cuts 13b and 14b surround and tightly contact the lead 7a, making it possible to appropriately prevent the adhesive 15 from flowing out during the pouring of the adhesive 15.

Figure 7C:
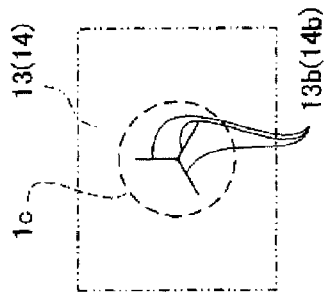
FIGS. 7A to 7F are plan views of an essential part of the insulating sheet or the flexible printed circuit board according to another embodiment of the present invention.
Figure 7F:
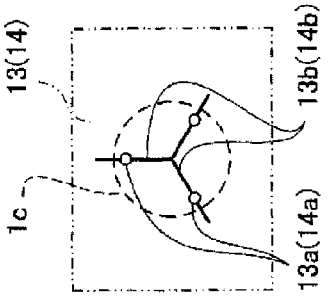
Figure 7B:
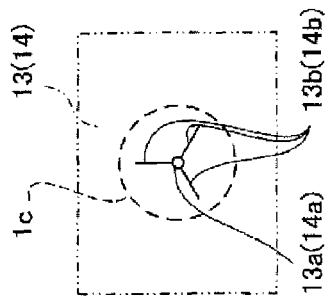
Figure 7E:
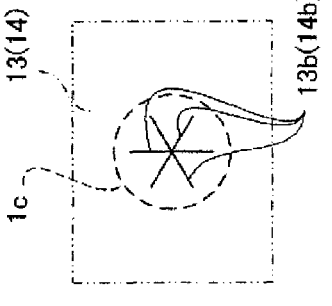
Figure 7A:
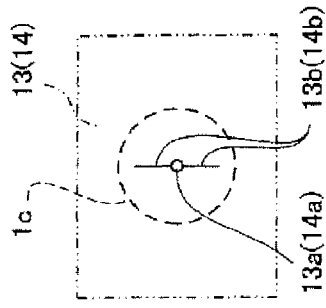

In the above-described embodiment, as shown in FIGS. 2A and 2B, the six cuts 13b or 14b are formed in the insulating sheet 13 or the flexible printed circuit board 14 around the hole 13a or 14a, respectively. However, the present invention is not limited to this aspect. For example, if the insulating sheet 13 or the flexible printed circuit board 14 is very thin or relatively flexible and soft, the number of the cuts 13b or 14b may be reduced as shown in FIG. 7A (the number of the cuts 13b or 14b is two in FIG. 7A and three in FIG. 7B). In any case, the cuts 13b and 14b preferably have the same shape and are spaced at equal angles. This is because when the end of the lead 7a is pushed in and held, the areas between the cuts 13b or 14b can be prevented from being biased and deformed or held in a biased position. Furthermore, when the holes 13a and 14a are formed in the center of the cuts 13b and 14b, respectively, the lead 7a of the coil 7 can advantageously be easily inserted into the holes and easily folded inward.

Figure 7D:
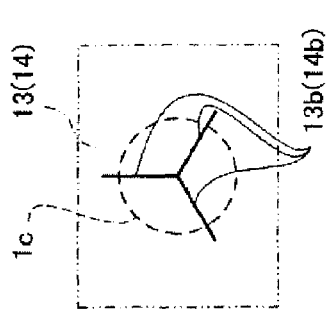
Figure 8A:
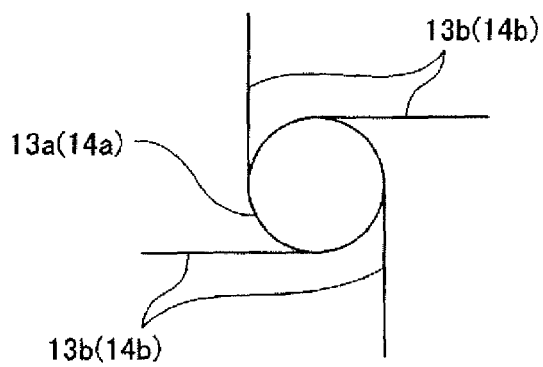
FIGS. 8A to 8C are plan views of an essential part of the motor, showing another example of cuts according to an embodiment of the present invention.
Figure 8B:
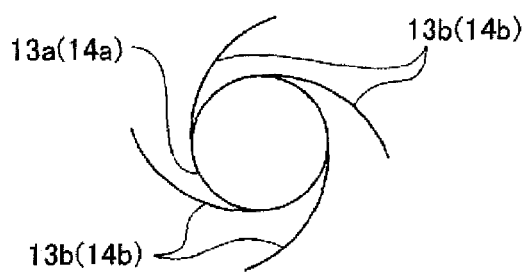
Figure 8C:
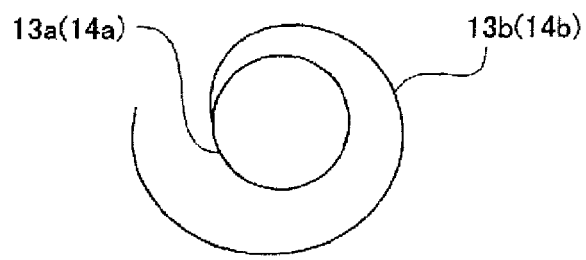
Figure 9A:
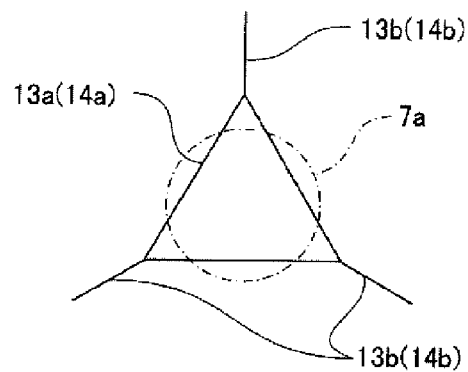
Figure 9B:
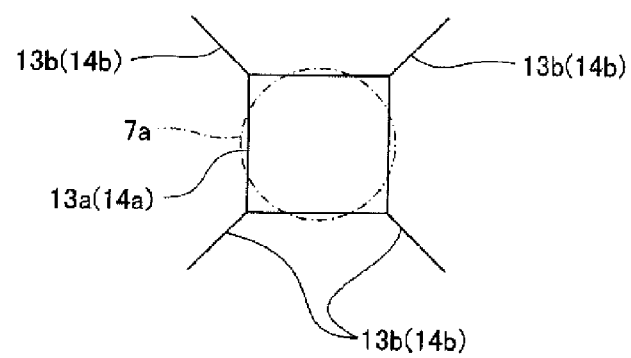
Figure 9C:
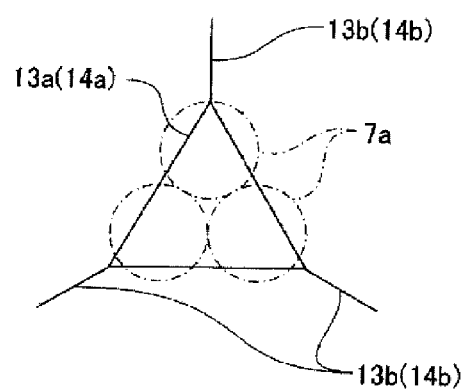
Figure 10:
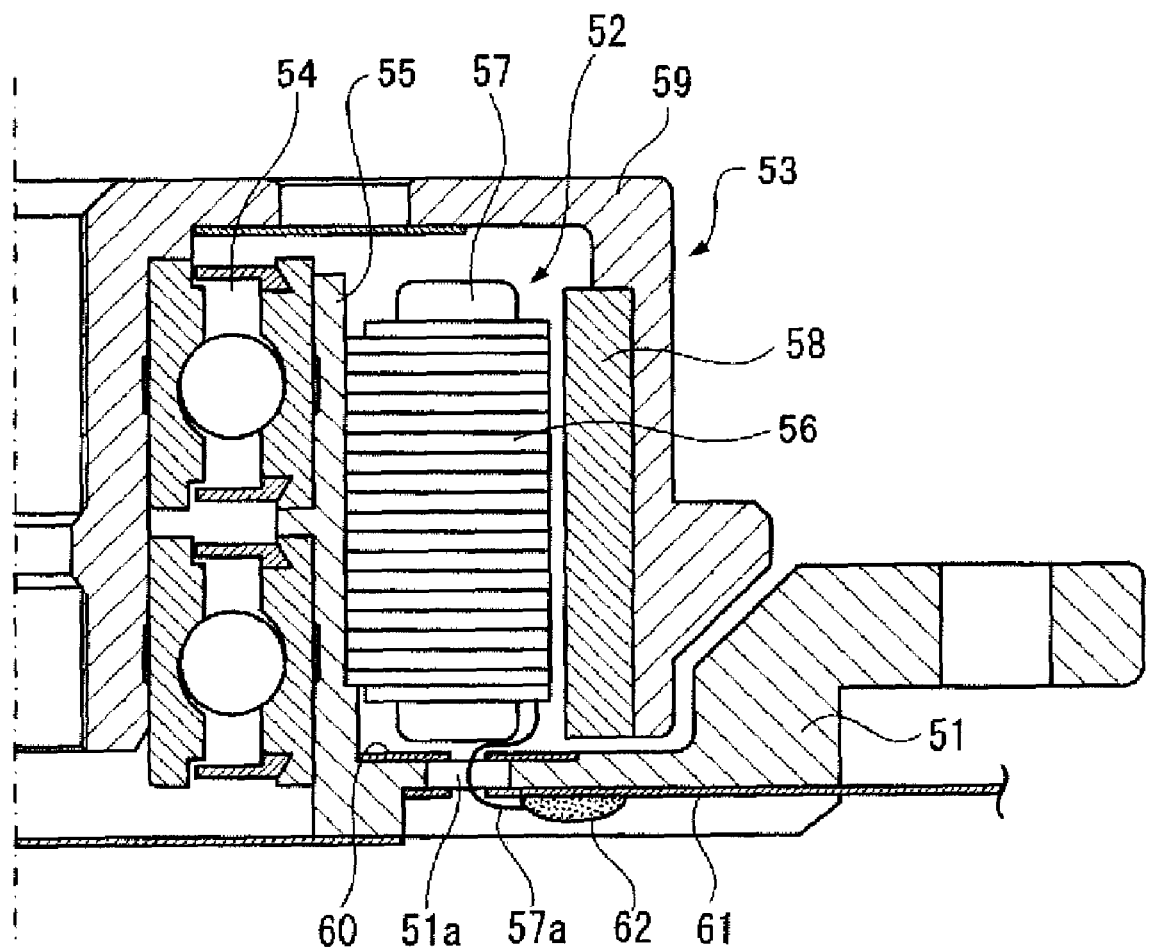
FIG. 10 is a sectional view of a conventional motor.
Figure 11A:
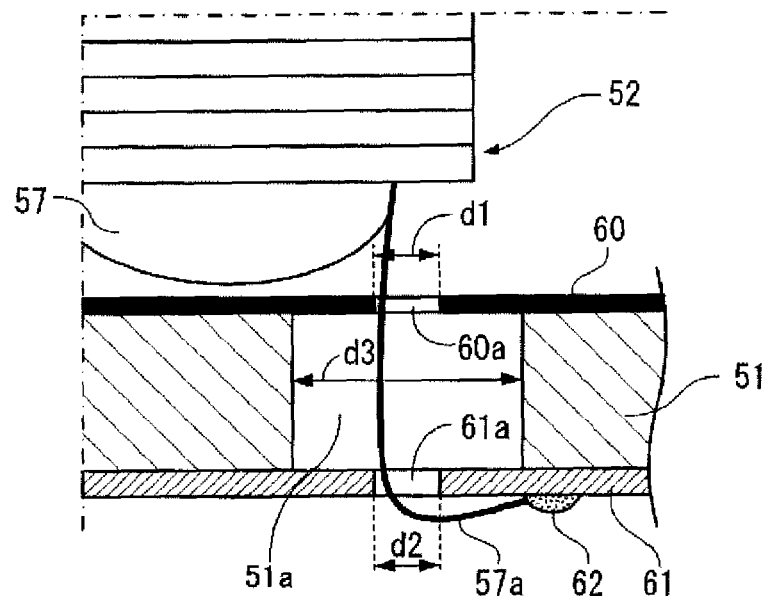
FIGS. 11A and 11B are enlarged sectional views of an essential part of the conventional motor.
Figure 11B:
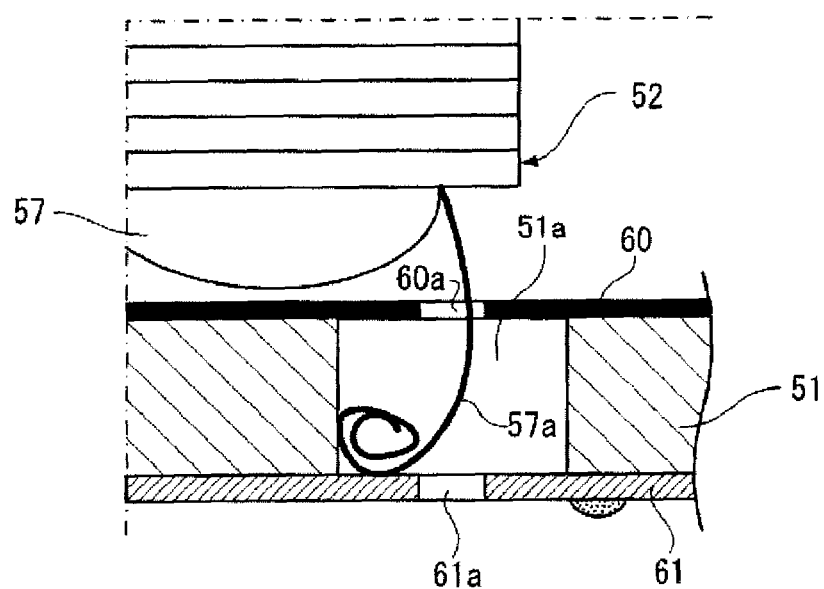
Figure 12:
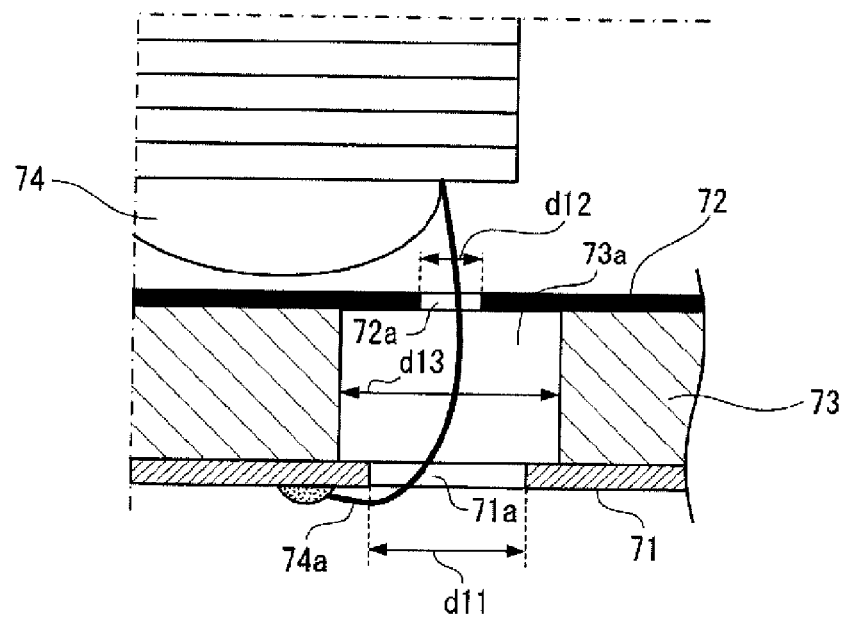
FIG. 12 is an enlarged sectional view of an essential part of another conventional motor.
Figure 13:
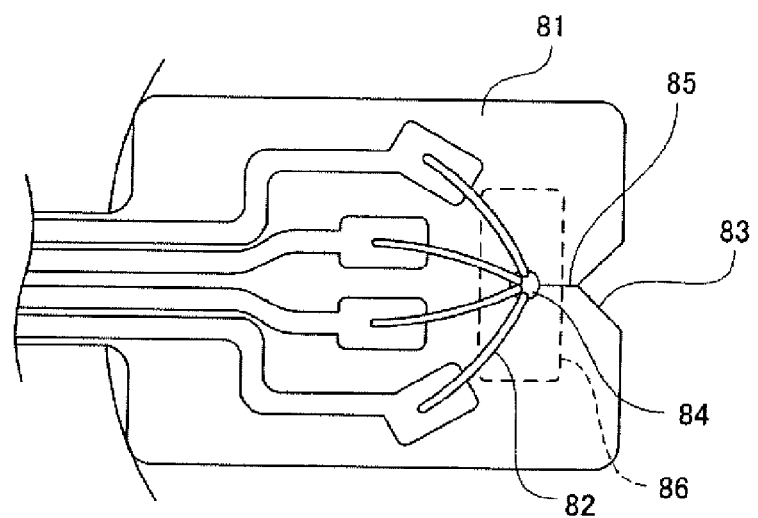
FIG. 13 is an enlarged plan view of an essential part of a flexible printed circuit board and the like in yet another conventional motor.

The hole 13a or 14a need not necessarily be formed in the insulating sheet 13 or the flexible printed circuit board 14. The plurality of cuts 13b, 14b may simply be radially formed so as to spread from the central part as shown in FIGS. 7C to 7E or spirally formed as shown in FIGS. 5A to 8C. Even in this case, when the end of the lead 7a is pressed against the area in which the cuts 13b, 14b are formed or its nearby area, the area is pushed open like a valve and tilted so as to guide the lead 7a toward the central part of the cuts 13b, 14b. As a result, the end of the lead 7a can be guided, introduced, and inserted into the hole formed in the central part of the cuts 13b. Furthermore, even in this case, the leading ends and the like of the areas between the cuts 13b surround and tightly contact the lead 7a. This makes it possible to appropriately prevent the adhesive 15 from flowing out during the pouring of the adhesive 15. If only the cuts 13b, 14b are formed with the formation of the hole 13a, 14a avoided, it is more difficult to push open the area in which the cuts 13b, 14b are formed when the leading end of the lead 7a is pressed against the area, than if the hole 13a, 14a is also formed. Thus, in this case, at least three cuts 13b, 14b are preferably formed. An increased number of cuts 13b, 14b allow the lead 7a to be more easily led through the motor. The absence of the holes 13a and 14a advantageously allows the lead 7a of the coil 7 to be more reliably held in the central part.

As shown in FIGS. 5A to 9C, the lead lead-out portions 13a and 14a may be triangular or rectangular.

Each of the lead lead-out portions 13a and 14a constitutes a hole with a diameter smaller than the thickness of the lead 7a or the total thickness of a plurality of the leads 7a. This allows the lead 7a or the plurality of leads 7a to be reliably held in the central part.

In this case, as shown in FIGS. 7C and 7E, in a plan view, the cuts 13b and 14b are preferably formed within the range in which the hole 1c in the base 1 is formed, more specifically, the cuts 13b and 14b are preferably formed to provide a gap from the peripheral wall portion of the hole 1c in the base 1 which gap is sufficient to ensure the appropriate breakdown voltage.

However, if the insulating sheet 13 or the flexible printed circuit board 14 is very difficult to deform, as shown in FIG. 7D, in a plan view, the cuts 13b or 14b can be formed to exceed the range in which the hole 1c in the base 1 is formed. However, in this case, a separate arrangement for ensuring the appropriate breakdown voltage is desirably additionally provided. For example, as shown in FIG. 7F, an edge stop hole 13c, 14c is formed in the middle of each of the cuts 13b, 14b so that even if the lead 7a moves to the hole 13c, 14c, the lead 7a is held at a predetermined distance from the peripheral wall portion of the hole 1c in the base 1. This ensures the appropriate breakdown voltage.

The present invention is applicable not only to motors for had disk drives but also to motors for video tape recorders and the like.

What is claimed is:

1. A motor comprising:
   a substantially planar base;
   a core directly or indirectly fixed to a first surface of the base and having a salient pole;
   a coil wound around the salient pole of the core;
   a flexible insulating sheet on the first surface of the base;

a flexible printed circuit board on a second surface of the base;

a base hole in the base and penetrating the base from the first surface to the second surface, lead lead-out holes in the printed circuit board and the insulating sheet, respectively, at a position located opposite the base hole;

a cut in at least one of the printed circuit board and the insulating sheet and continuous with the lead lead-out hole and extending substantially spirally toward a periphery of the lead lead-out hole;

a lead penetrating the lead lead-out hole in the insulating sheet, the base hole, and the lead lead-out hole in the printed circuit board and electrically connected to a land on the printed circuit board, the lead being held by the lead lead-out hole; and a resin in the base hole between the insulating sheet and the printed circuit board thereby fixing the lead inside the base hole.

2. The motor according to claim 1, wherein the lead lead-out hole around which the cut is formed is a hole smaller than thickness of the lead penetrating the lead lead-out portion.

3. The motor according to claim 1, wherein the resin fixing the lead is an adhesive.

4. The motor according to claim 1, wherein the cut does not reach a peripheral part of the printed circuit board or the insulating sheet.

5. The motor according to claim 1, wherein the plurality of cuts are located around a center of the lead lead-out hole at equal radial angles.

6. The motor according to claim 1, wherein a hole smaller than the base hole is formed within an area corresponding to an inside of the base hole in middle of the cut.

7. The motor according to claim 1, wherein the cut is formed only within an area located inside the base hole.

8. A motor comprising:

a substantially planar base;

a core directly or indirectly fixed to a first surface of the base and having a salient pole;

a coil wound around the salient pole of the core;

a flexible insulating sheet on the first surface of the base;

a flexible printed circuit board on a second surface of the base;

a base hole in the base and penetrating the base from the first surface to the second surface, lead lead-out holes in the printed circuit board and the insulating sheet, respectively, at a position located opposite the base hole;

a cut in at least one of the printed circuit board and the insulating sheet and continuous with the lead lead-out hole and extending substantially radially or spirally toward a periphery of the lead lead-out hole;

a lead penetrating the lead lead-out hole in the insulating sheet, the base hole, and the lead lead-out hole in the printed circuit board and electrically connected to a land on the printed circuit board, the lead being held by the lead lead-out hole; and a resin in the base hole between the insulating sheet and the printed circuit board thereby fixing the lead inside the base hole, wherein the lead is fixed to a substantially central position in the hole in the base.

* * * * *